(12) United States Patent
Sinnett et al.

(10) Patent No.: US 7,196,617 B2
(45) Date of Patent: Mar. 27, 2007

(54) GRADUATED STIFFNESS FOR ELECTRICAL CONNECTIONS IN TIRES

(75) Inventors: Jay C. Sinnett, Greenville, SC (US); David J. Myatt, Chateaugay (FR); Arthur R. Metcalf, West Bay (CA)

(73) Assignee: Michelin Recherche et Technique S.A. (CH)

(*) Notice: Subject to any disclaimer, the term of this patent is extended or adjusted under 35 U.S.C. 154(b) by 248 days.

(21) Appl. No.: 10/932,960

(22) Filed: Sep. 2, 2004

(65) Prior Publication Data

US 2005/0231343 A1    Oct. 20, 2005

Related U.S. Application Data

(63) Continuation-in-part of application No. 10/827,593, filed on Apr. 19, 2004.

(51) Int. Cl.
*B60C 23/00* (2006.01)
(52) U.S. Cl. .............. 340/445; 340/442; 152/152.1; 73/146; 73/146.5; 116/34 R
(58) Field of Classification Search ......... 340/445, 340/442; 152/152.1
See application file for complete search history.

(56) References Cited

U.S. PATENT DOCUMENTS

| | | | |
|---|---|---|---|
| 3,787,806 A * | 1/1974 | Church | ............ 340/447 |
| 4,911,217 A | 3/1990 | Dunn et al. | |
| 5,448,110 A | 9/1995 | Tuttle et al. | |
| 5,573,611 A * | 11/1996 | Koch et al. | ............ 152/152.1 |
| 5,960,844 A | 10/1999 | Hamaya | |
| 6,078,791 A | 6/2000 | Tuttle et al. | |
| 6,121,880 A | 9/2000 | Scott et al. | |
| 6,217,683 B1 | 4/2001 | Balzer et al. | |
| 6,443,198 B1 | 9/2002 | Koch et al. | |
| 6,444,069 B1 | 9/2002 | Koch et al. | |
| 6,462,650 B1 | 10/2002 | Balzer et al. | |
| 6,474,380 B1 | 11/2002 | Rensel et al. | |
| 6,582,363 B2 | 6/2003 | Adachi et al. | |
| 6,688,353 B1 * | 2/2004 | Koch | ............ 152/152.1 |
| 6,705,365 B1 | 3/2004 | Wilson | |
| 6,734,791 B2 | 5/2004 | Kelly et al. | |
| 6,772,505 B1 | 8/2004 | Logan et al. | |
| 6,853,347 B2 | 2/2005 | Forster et al. | |

(Continued)

FOREIGN PATENT DOCUMENTS

WO    WO 03105509    6/2002

(Continued)

*Primary Examiner*—Donnie L. Crosland
(74) *Attorney, Agent, or Firm*—Dority & Manning, P.A.

(57) ABSTRACT

A strain-resistant electrical connection and a method of making the same is provided. A wire or other conductive lead is connected to a circuit in a manner that makes the connection more resistant to mechanical stresses such as movement or rotation of the lead relative to the circuit. A material is configured around the lead and near the point of connection to the circuit so as to create a region of decreasing flexibility or graduated stiffness near the point of connection. In certain embodiments, the lead may also be coiled or otherwise shaped to provide additional ability to withstand mechanical stresses. In other embodiments, additional elements may be provided to assist in controlling the stiffness near the connection point.

49 Claims, 4 Drawing Sheets

U.S. PATENT DOCUMENTS

| | | |
|---|---|---|
| 6,885,291 B1 * | 4/2005 | Pollack et al. ............... 340/445 |
| 2004/0021558 A1 | 2/2004 | Kelly et al. |
| 2004/0164558 A1 | 8/2004 | Adamson et al. |
| 2004/0184456 A1 | 9/2004 | Myatt |
| 2005/0076992 A1 * | 4/2005 | Metcalf et al. .......... 156/110.1 |
| 2005/0126668 A1 * | 6/2005 | Fornerod ................. 152/152.1 |

FOREIGN PATENT DOCUMENTS

| | | |
|---|---|---|
| WO | WO 03105511 | 6/2002 |

\* cited by examiner

GRADUATED STIFFNESS FOR ELECTRICAL CONNECTIONS IN TIRES

CROSS-REFERENCE TO RELATED APPLICATIONS

The present application is a continuation-in-part of U.S. patent application Ser. No. 10/827,593, filed Apr. 19, 2004, entitled STRAIN-RESISTANT ELECTRICAL CONNECTION, to which Applicants claim priority.

TECHNICAL FIELD OF THE INVENTION

The present invention relates to a strain or fatigue-resistant electrical connection and a method of making the same. More specifically, the present invention provides for a connection between a lead and a circuit in a manner that makes the connection more resistant to damage caused by mechanical stresses such as movement or rotation of the lead relative to the circuit. In the present invention, a material is configured around the lead so as to create a region of decreasing flexibility or graduated stiffness near the point of connection. In certain embodiments, the lead may also be coiled or otherwise shaped to provide additional ability to accommodate mechanical strain without failure.

BACKGROUND OF THE INVENTION

Electrical circuits are used in a variety of environments that can present particular physical, chemical, and electrical factors for which the circuit must either be protected or be designed to endure. The present invention primarily concerns physical factors such as mechanical stress leading to fatigue, which in turn can cause a circuit malfunction by physically breaking or weakening a specific part of the circuit. A typical location for such malfunction is at or near the point of connection of a wire, lead, or other conductor to an electrical circuit. In circumstances where the wire and the connected-to circuit may move or rotate relative to one another, the wire may incur a concentration of mechanical stress and/or fatigue at or near the point of connection to the circuit. Mechanical stresses such as repeated bending or twisting, for example, can lead to a weakening of the wire until a break occurs.

Figure 1:
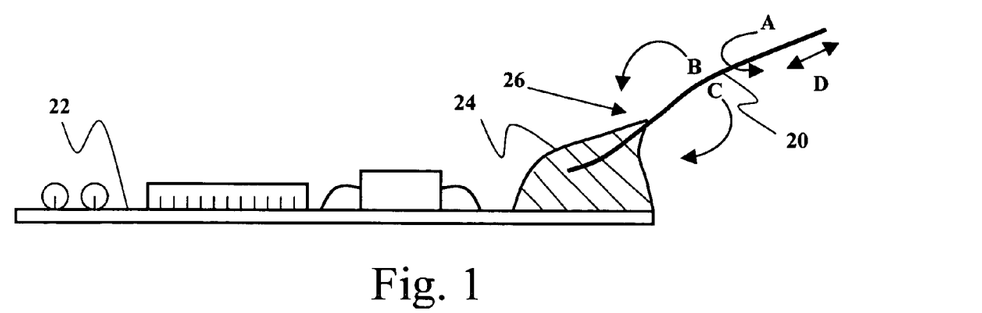
FIG. 1 illustrates an example of an electrical connection in which a lead is soldered to a printed circuit board.
Figure 2:
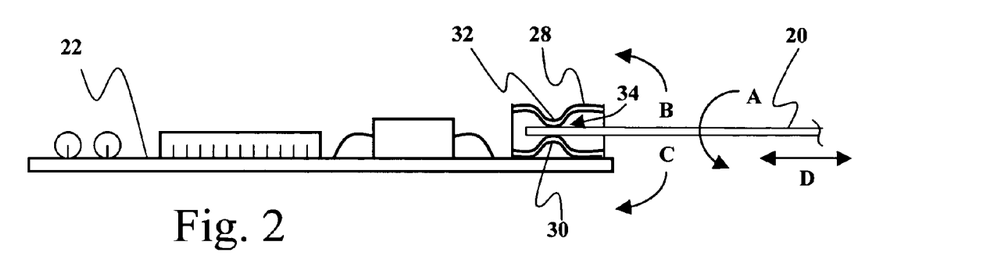
FIG. 2 illustrates an example of an electrical connection in which a lead is mechanically connected to a printed circuit board.

FIGS. 1 and 2 provide examples of the problems addressed. In FIG. 1, lead 20 is connected to a printed circuit board 22 by a soldered connection 24. As lead 20 is twisted (as illustrated by arrow A), repeatedly bent (as illustrated by arrows B and C), or placed into tension or compression (arrow D), a concentration of stress occurs at or near the point of connection 26. Over time, as lead 20 is exposed to repeated mechanical cycles that provide for this concentration of stress, lead 20 may eventually weaken due to repeated deformation or cyclical movement. As a result, lead 20 will likely suffer a fatigue failure (or break) either at or near point of connection 26. Similarly, in FIG. 2, lead 20 is connected to printed circuit board 22 by a physical connector 28 that secures the connection of lead 20 by physically compressing or pinching lead 20 between crimping surfaces 30 and 32. Again, as lead 20 is subjected to a variety of forces as illustrated by arrows A, B, C, and D, lead 20 may weaken and eventually break due to repeated deformations at or near point of connection 34. An electrical connection more resistant to various forces and less likely to undergo fatigue failure is desirable.

SUMMARY

Various features and advantages of the invention will be set forth in part in the following description, or may be apparent from the description.

The present invention provides an electrical connection, and a method of creating such connection, that is resistant to mechanical stresses that can occur when a wire or lead is twisted or caused to bend repeatedly about its connection to a circuit. Generally speaking, with the present invention a material is provided that surrounds the lead and associated circuit board and in the area near the point of connection to the circuit creates a region of decreasing flexibility or graduated stiffness near the point of connection. The material is selected and configured with the lead so that it will distribute some of the mechanical stress created by movement or twisting of the lead relative to a substrate or other surface carrying the circuit to which the lead is connected. By providing a region of graduated stiffness/decreasing flexibility near the location of the connection to the circuit, the concentration of stress in the lead at the point of connection to the circuit is minimized (or even avoided) through a greater distribution of the stress over the end of the lead and into the surrounding material. As such, a more robust connection to certain mechanical stresses is realized. In certain embodiments, the lead may also be coiled or otherwise shaped to provide an additional ability to absorb and dissipate mechanical forces. A variety of materials may be used to create the region of graduated stiffness about the lead, and some representative examples are provided herein. Selected exemplary embodiments and methods, including preferred, of the present invention are here summarized by way of explanation of the invention and not limitation of the invention.

In one exemplary method of the present invention, a process for creating a fatigue-resistant electrical connection is provided in which an electrical conductor having at least one end is configured for connecting to an electrical circuit. A predetermined area proximate such end length of the electrical conductor is configured as a stress distribution area. The stress distribution area is created using stress distributing materials over a predetermined length of the electrical conductor, in some cases over the entire length of the electrical conductor. The stress distribution area can be created in a variety of ways and may include various techniques including various forms of adhesion, gluing, and bonding of stress distributing materials and/or specialized mechanical connection methodologies. The end of the electrical conductor is connected to the electrical circuit. Such connection may include soldering or a mechanical connection such as a crimp. Preferably the electrical conductor is bonded to the stress distributing material, preferably a resilient material, along the predetermined length of the conductor. While a variety of resilient materials might be employed, some examples include rubbers or other elastomeric materials. To further enhance the stress-resistance of the circuit, the conductor may be constructed from a wire that is coiled or otherwise shaped in a manner that helps distribute stress.

In another exemplary method of the present invention, a process for assembling a strain-resistant electrical connection to an electrical circuit is provided. The process includes providing a resilient material capable of distributing mechanical forces completely encasing a printed circuit board and an electrical conductor connected thereto at a first end thereof to a connection point on the printed circuit board. The resilient material is bonded, for example, using suitable glue, to the printed circuit board and the electrical conductor. The first end of the electrical conductor is connected to the electrical circuit in a manner that fixes the position of the first end relative to the printed circuit board. As such, the resilient material provides a transition zone for the electrical conductor in which the mobility of the conductor along the end in a direction moving along the conductor and towards the electrical circuit is gradually reduced.

The present invention also provides embodiments of a stress-resistant electrical connection. In one exemplary embodiment of the present invention, a durable connection for an electrical circuit is provided that includes a substrate supporting at least a portion of the electrical circuit. A conductor is included that has at least one connecting end attached to the electrical circuit. A resilient material is positioned proximate to the connecting end and surrounds a predetermined portion of the conductor. The resilient material is attached to the substrate and is configured for gradually restricting the mobility of the conductor along the end in a direction moving along the conductor and towards the electrical circuit.

In another exemplary embodiment, the present invention provides a strain-resistant electrical connection to an electrical circuit mounted on a printed circuit board that includes a transition zone for distributing stress. A wire conductor is provided having a first end; a portion of the conductor near the first end is coiled and embedded within a material for distributing stress. The wire connection point encloses at least a portion of the stress distributing material and physically contacts and restrains the wire at a location proximate to its first end so as to provide an electrical connection. The material for distributing stress is bonded to the printed circuit board such that the electrical conductor is substantially immovable relative to the circuit. The material for distributing stress is configured to provide a zone of graduated stiffness about the wire at a location proximate to the first end.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Repeat use of reference characters throughout the present specification and appended drawings is intended to represent same or analogous features or elements of the invention.

DETAILED DESCRIPTION OF PREFERRED EMBODIMENTS

Reference will now be made in detail to embodiments of the invention, one or more examples of which are illustrated in the drawings. Each example is provided by way of explanation of the invention, and not meant as a limitation of the invention. For example, features illustrated or described as part of one embodiment can be used with another embodiment to yield still a third embodiment. It is intended that the present invention include these and other modifications and variations.

Figure 3:
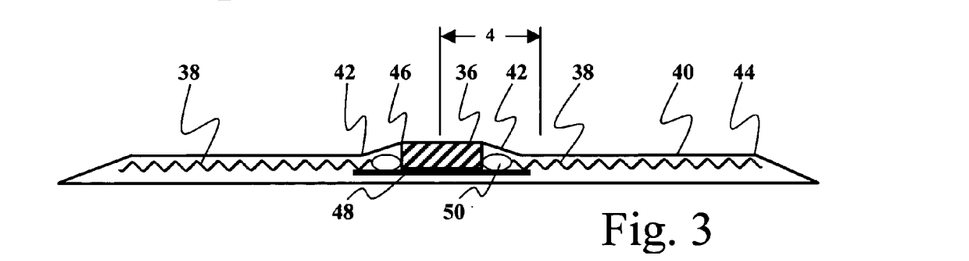
FIG. 3 illustrates a side cross section of an exemplary embodiment of the present invention.
Figure 4:
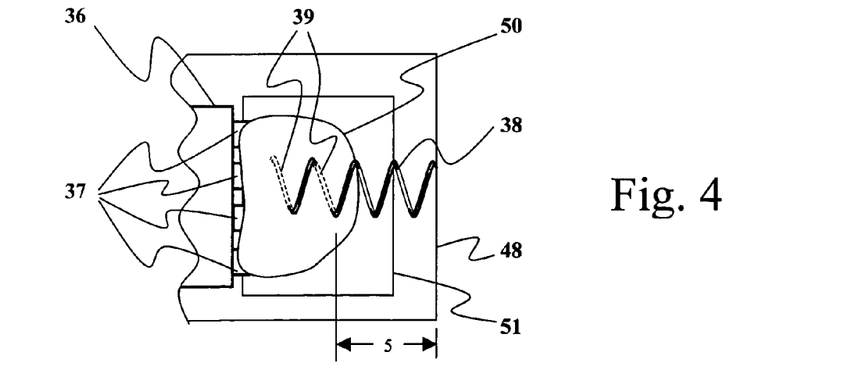
FIG. 4 illustrates an enlarged plan view of a portion of the exemplary embodiment illustrated in FIG. 3.

FIGS. 3 and 4 provide side cross-section and partial plan illustrations respectively of an exemplary embodiment of the present invention. The particular illustrations represent a tire patch as might be used to house tire electronics for mounting in association with a tire. As shown, an exemplary tire electronics circuit element 36 is mounted on printed circuit board 48 and the combination is encased in an elastomeric tire patch 40. In this embodiment, electrical conductors 38 are connected to circuit element 36 via solder connection 50, solder pad 51 and a plurality of terminals 37. Electrical conductors 38 may be coiled and may comprise a dipole antenna for the tire electronics that may, as an example only, comprise a radio frequency identification (RFID) device. The electrical conductors 38 are securely connected to the electronic circuit 36 by embedding at least portions 39 of the coils within solder connection 50. A portion of the electrical conductors 38 remains free from the solder, yet adjacent printed circuit board 48. This portion of the electrical conductors 38 is illustrated as residing in zone 5. Specifically, the coil portions not embedded in solder connection 50 but yet adjacent printed circuit board 48 are embedded in the elastomeric material forming patch 40. These coil portions of electrical conductor 38 within zone 5 can, within the constraints produced by the elastomeric material forming patch 40, contract, expand, or rotate so as to further reduce the concentration of stress at the point where the electrical conductor 38 enters the solder. By providing the configuration illustrated in zone 5, electrical conductor 38 remains adjacent a ridged supporting structure to which the elastomeric material forming the patch 40 is adhered. In addition, the patch 40 forming elastomeric material may be adhered to electrical conductor 38 so that the combination produces a zone of graduated stiffness. Although shown as helical, electrical conductors 38 could also be provided with other shapes, such as, although not limited to, a sinusoidal shape, in order to improve resistance to damage caused by stress.

Certain aspects of the tire patch itself lend important design consideration to the concept of overall stress reduction. For example, in a tire environment where tire electronics devices such as the illustrated RFID device may be installed in mechanically active areas of the tire, designing the tire patch with the smallest possible dimensions in both thickness and surface area make the patch more compliant and reduce stresses imposed not only on the contained electronics device and connections, but also on the adhesives that may be used to secure the tire patch to the tire. One non-limiting example of this concept may be seen from FIGS. 3 and 4 wherein the electrical conductors 38 may represent an antenna structure that is 1 mm thick. In such an instance, that portion of the elastomeric tire patch 40 holding the antenna may be 2 mm thick or less allowing approximately 0.5 mm of elastomeric material above and below the antenna to provide support for the antenna as well as protection from attack by chemicals and loose objects within the tire. If any component requires more than 2 mm of height, then such components may be supported with a small "mesa" 46 in the elastomeric material with steeply sloping sides as illustrated at 42 in FIG. 3. In constructing a tire patch in accordance with the present invention, it is beneficial to incorporate at least a 2 mm radius of curvature wherever two or more surfaces of rubber meet, as at 42 and 44 of FIG. 3, to prevent a destructive buildup of stress.

FIGS. 5 through 10 provide illustrations of six exemplary embodiments of stress reductions methodologies for use with an electrical connection according to the present invention. Features common to each of these embodiments include a printed circuit board 48 as might be found in any electronics device, an electrical conductor 38 and an encasing resilient material housing 40. The resilient material could be a rubber or another elastomeric material having suitable properties. Using the teachings disclosed herein, one of ordinary skill in the art would understand that a variety of materials could be used for the resilient material of the housing 40. Housing 40 may form part or all of a tire patch or may represent adjacent portions of a tire's architecture.

For these particular examples, a wire or other electrical conductor 38 is connected by way of solder connection 50 to a component (not illustrated) on printed circuit board 48. Although each of the embodiments illustrates the use of a solder connection 50 of the electrical conductor 38 to printed circuit board 48, it should be appreciated that other connection methodologies might be employed, such as the crimped connection technique illustrated in FIG. 2. While a number of connection methodologies may be used with the present invention, a principle concept common to all the illustrated embodiments resides in the provision of a graduated stiffness in the stress distributing material surrounding the electrical connection. Although a printed circuit board 48 is used to illustrate these particular exemplary embodiments, it should be appreciated that the present invention is not limited to use with only a circuit board. The present technology may, for example, be applied to the electrical connection of a single electrical conductor to a single electrical component not necessarily mounted to a printed circuit board. Finally, with respect to each of these embodiments, although elastomeric housing 40 is illustrated as a generally oval area surrounding the exemplary illustrated components, the housing 40, none-the-less, is designed to conform to the design principles discussed with respect to FIGS. 3 and 4 hereinabove.

Figure 5:
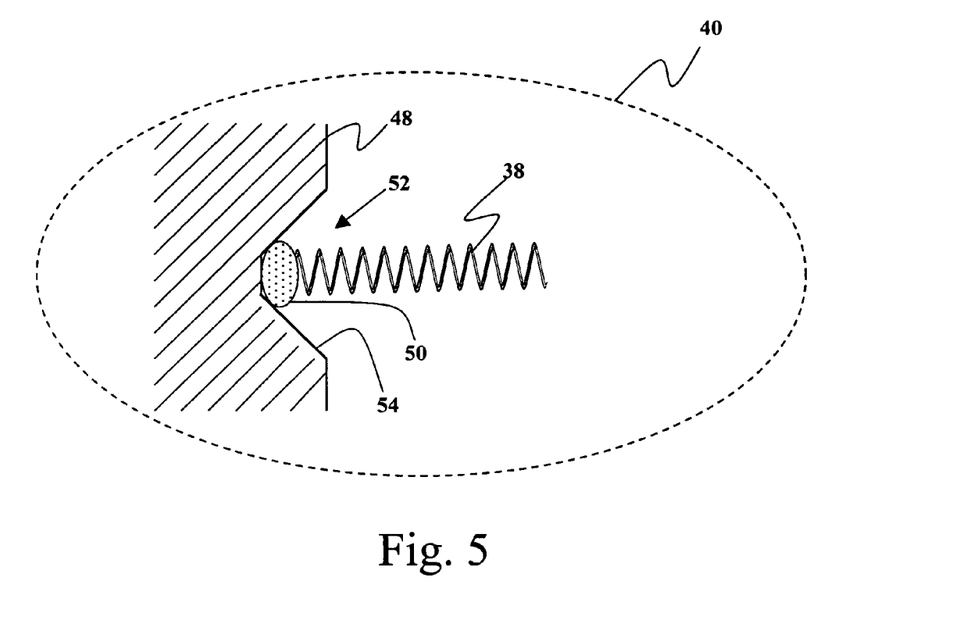
FIGS. 5–10 illustrate various exemplary stress relieving methodologies according to the present invention.

With reference now to FIG. 5, a representatively illustrated elastomeric housing 40 is shown surrounding printed circuit board 48 and electrical conductor 38. Electrical conductor 38 is connected to printed circuit board 48 by way of solder connection 50 within a recessed area 52 formed by sloped side walls 54. Elastomeric material contained within the recessed area 52 and forming a portion of the housing 40 cooperates with the walls 54 of the recessed area 52 to provide an area of increased stiffness in the vicinity of the solder connection 50. In addition, as illustrated in FIG. 5, the electrical conductor 38 is coiled to provide, in cooperation with elastomeric material 40 and the proximity of sloped side walls 54, a graduated stress reduction zone similar to that described with respect to FIG. 4.

Figure 6:
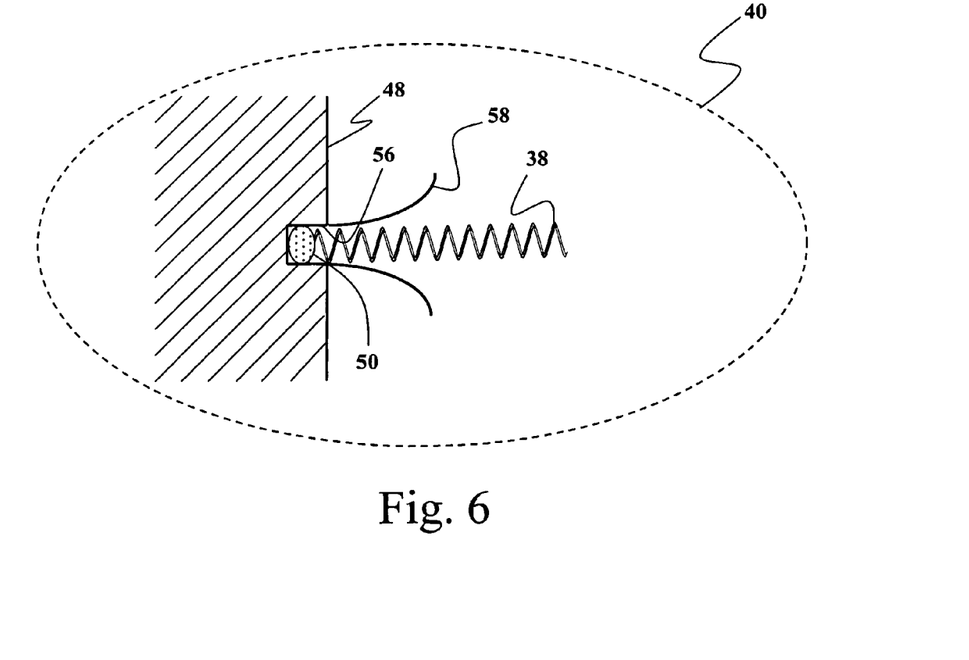

With reference now to FIG. 6, an alternative embodiment of the present invention is illustrated. In this embodiment, a recess 56 is created in the printed circuit board 48 and additional stiffening wires 58 are provided and soldered into place along with electrical conductor 38. The additional stiffening wires 38 extend for a distance from the recess 56 into the elastomeric material forming housing 40 and thereby assist in creating a zone of increased stiffness and thereby additional stress reduction within the housing 40 at the point of connection of the electrical wire 38 to the printed circuit board 48.

Figure 7:
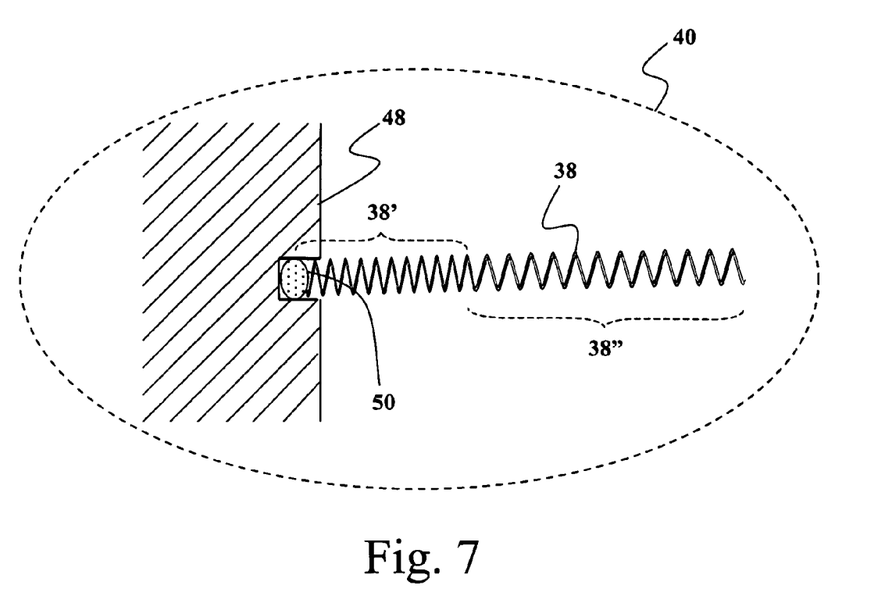

The embodiment of the present invention illustrated in FIG. 7 provides a variation of the FIG. 6 embodiment by providing the function of the stiffening wires 58 in the form of a section 38' of coils in the vicinity of the solder connection 50 within the coiled electrical conductor 38 having a higher pitch, i.e. having a greater number of turns per unit length, than the more remote section 38" of the electrical conductor 38. The higher number of turns per unit length in the area closest to the solder connection point provides a zone of increased stiffness in the area of the solder connection 50 through interaction of the elastomeric housing material by operation of the housing material surrounding a larger number of coil turns in the area of the solder connection 50 versus the number of coil turns encased in the more remote section 38" of the electrical conductor 38. By gradually decreasing the mobility of electrical conductor 38 along a transition zone, any stress applied to electrical conductor 38 is distributed throughout its length instead of concentrating the stress in a particular location such as point of connection 50. As a result, the local strain on electrical conductor 38 is reduced or eliminated at or near the point of connection 50, and the likelihood of a breaking or weakening the connection at point 50 is also decreased or removed. It should be appreciated that, although the illustrated embodiment features two areas 38', 38" of varying pitch, more that two such areas may be provided and, in fact, the pitch could be continuously varied over the length of the electrical conductor 38.

Figure 8:
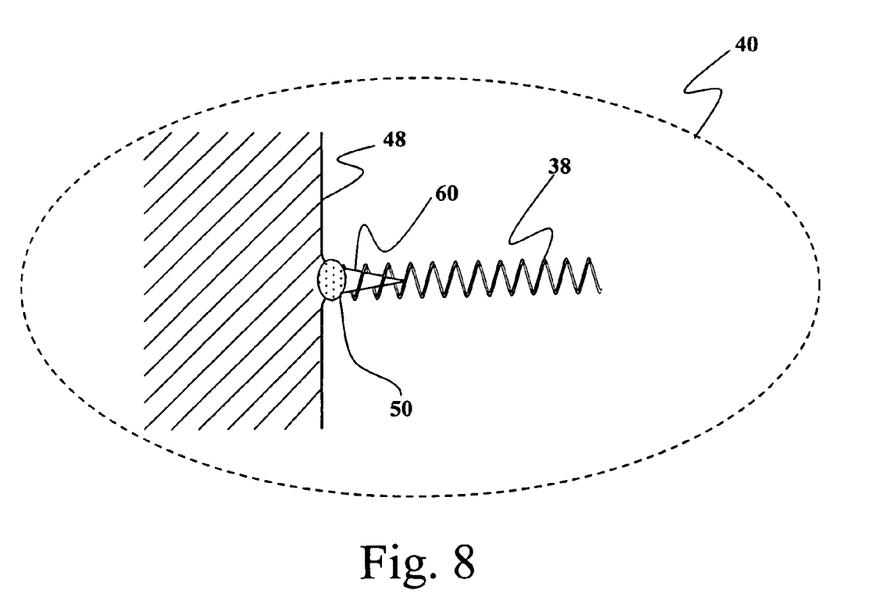

With reference now to FIG. 8, yet another embodiment of the present invention is illustrated. In the illustrated embodiment, additional stiffening is provided by a protrusion 60 extending from a portion of the printed circuit board 48. Protrusion 60 is configured such that one or more coil turns associated with the electrical conductor 38 may fit over the protrusion 60 and be connected thereto by solder connection 50. As with the previously discussed embodiments, the presence of protrusion within a portion of the coil turns of electrical conductor 38 coupled with the surrounding elastomeric material 40 operates to produce a zone of increased stiffness and thereby functions to distribute any strain applied to the electrical conductor 38, most particularly at the solder connection 50.

Figure 9:
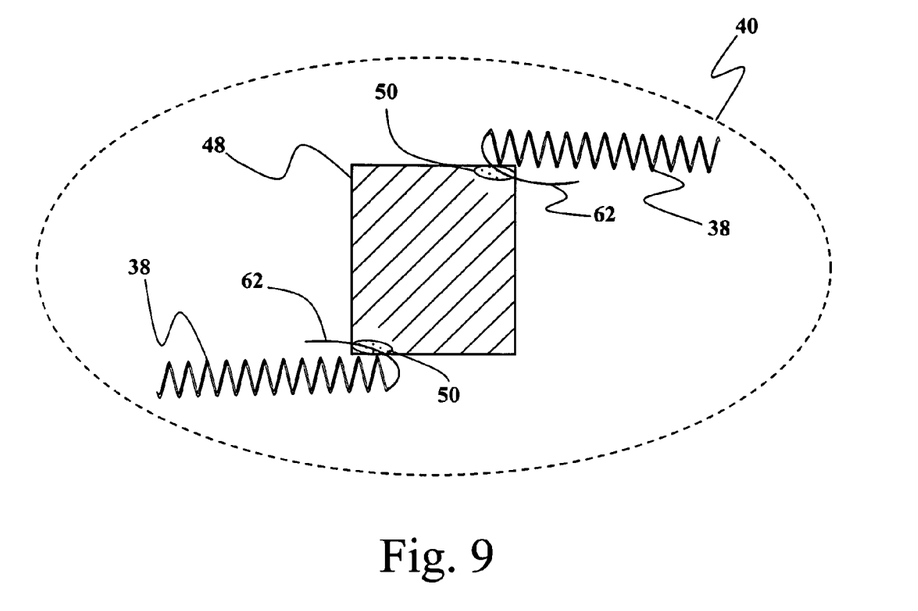

FIG. 9 is illustrative of yet another embodiment of the present invention that is somewhat reminiscent of the embodiment illustrated in FIG. 6. More particularly, the present embodiment makes use of a stiffening wire 62 in a manner somewhat like stiffening wires 58 illustrated in FIG. 6. In this embodiment, however, stiffening wire 62 is actually formed by straightening a portion of the electrical conductor 38 and soldering the straightened wire and at least a portion of one of the coils of the electrical conductor 38 to the circuit board 48. The straightened portion of the electrical conductor 38 then acts in concert with the surrounding elastomeric material to provide a zone of increased stiffness in much the same manner as stiffening wire 58 of the FIG. 6 embodiment of the invention.

Figure 10:
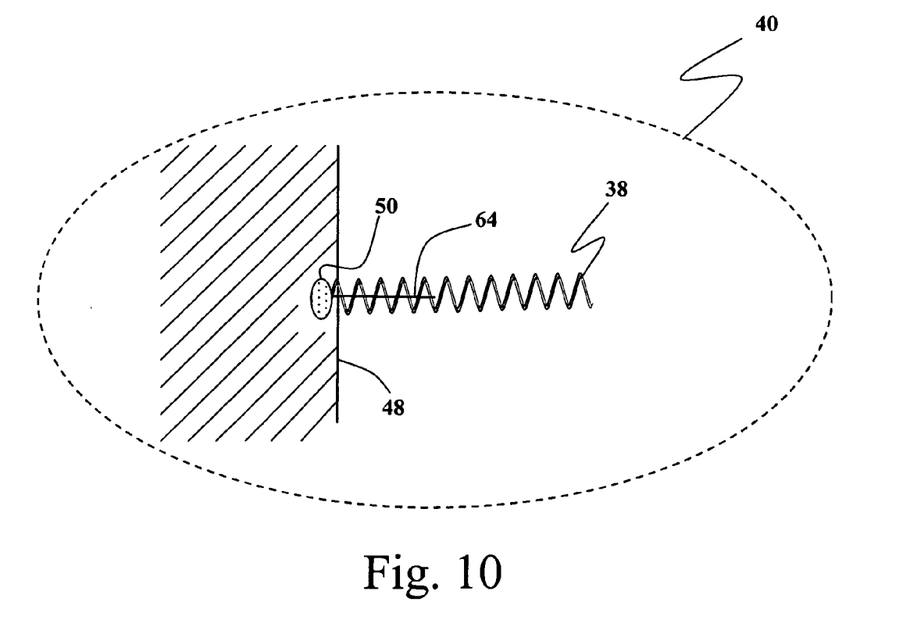

Turning finally to FIG. 10, still yet another embodiment of the invention is illustrated which features elements much like those of several previous embodiments. Like the embodiment illustrated in FIG. 9, this embodiment of the invention makes use of a straightened portion 64 of the electrical conductor 38. Also like the embodiment shown in FIG. 8, this embodiment positions that straightened portion 64 of electrical conductor 38 within several coils of the electrical conductor 38 at one end thereof. When soldered in place to printed circuit board 48 as shown, the straightened portion 64 operates in a manner similar to protrusion 60 of the FIG. 8 embodiment of the invention to provide, in concert with the surrounding elastomeric material, a zone of increased stiffness that provides distribution of any locally applied strain.

While several embodiments of the present invention have been illustrated with particularity, there are additional concepts that may be applied to each of these embodiments. As an example, stress resistance can be further enhanced through the geometry or shape used for electrical conductor 38 as has been previously discussed. In addition, electrical conductor 38 may be constructed from a material that increases the resiliency of solder connection 50. By way of example only, conductive polymer compounds, steel, stainless steel, spring steel, and spring steel coated with brass have been found by applicants to provide for a conductive and yet resilient electrical conductor 38. However, numerous other materials and shapes may be utilized as one of ordinary skill in the art will understand using the teachings disclosed herein. Additionally, in the event the material used for elastomeric housing 40 is conductive or otherwise negatively affects the conduction of electrical conductor 38, a nonconductive coating can be included around electrical conductor 38. By way of example only, using a nonconductive rubber with little or no carbon black present could provide such coating.

Finally, it will be advantageous if the elastomeric material of the housing 40 is actually bonded to the various components. That is, bonding the elastomeric material to the electrical conductor 38, for example, will increase the distribution of strain along the length of the electrical conductor 38 by insuring that the electrical conductor 38 does not slide within the elastomeric material. In addition, bonding the elastomeric material to the printed circuit board and, most especially, in the area of the solder connection 50 will assist in ensuring more uniform distribution of applied strain and thus significantly reduce the likelihood of strain induced damage to the solder connection 50 and other components within the tire electronics.

Using the teachings disclosed herein, one of ordinary skill in the art will appreciate that other embodiments of the present invention exist that fall under the scope of the appended claims. In fact, it should be appreciated by those skilled in the art that modifications and variations can be made to the connection and method as described herein, without departing from the scope and spirit of the claims. It is intended that the invention include such modifications and variations as come within the scope of the appended claims and their equivalents.

What is claimed is:

1. A method of creating a fatigue-resistant electrical connection in a tire patch, comprising the steps of:
   providing an electrical conductor having at least one end configured for connection to an electrical circuit;
   providing an electrical circuit including at least one connection point;
   connecting the at least one end of the electrical conductor to the at least one connection point; and
   encasing the electrical conductor and the electrical circuit in a stress reducing material so as to provide a transition zone wherein strain applied to the electrical conductor varies as a function of distance from the at least one connection point, whereby the stress reducing material distributes strain applied to the electrical conductor and forms the tire patch.

2. A method as in claim 1, further comprising the step of bonding the stress reducing material to the electrical conductor.

3. A method as in claim 1, wherein the stress reducing material is comprised of a resilient material.

4. A method as in claim 3, wherein the resilient material is comprised of rubber.

5. A method as in claim 4, where a portion of the rubber comprises a portion of a tire body.

6. A method as in claim 1, wherein the electrical circuit comprises a printed circuit board.

7. A method as in claim 6, wherein said step of encasing comprises bonding said the distributing material to the printed circuit board.

8. A method as in claim 1, wherein said step of connecting comprises soldering the electrical conductor to the connection point.

9. A method as in claim 1, wherein the electrical conductor comprises a coiled wire.

10. A method as in claim 9, wherein a non-conductive coating is applied to at least a portion of the electrical conductor along a predetermined length.

11. A method of creating a strain-resistant electrical connection to an electrical circuit in a tire patch, comprising:
    providing a resilient material capable of distributing mechanical forces;
    providing an electrical circuit mounted on a support, the electrical circuit having at least one connection point;
    positioning an electrical conductor proximate to the at least one connection point, the electrical conductor having a first end and a second end;
    connecting the first end of the electrical conductor to the connection point of the electrical circuit in a manner that fixes the position of the first end relative to the support; and
    attaching the resilient material to the support and the electrical conductor,
    whereby the resilient material provides a transition zone for the electrical conductor such that the mobility of the electrical conductor decreases along a direction from the second end of the electrical conductor towards the point of connection of the first end to the electrical circuit.

12. A method as in claim 11, further comprising the step of adhering the electrical conductor to the resilient material.

13. A method as in claim 11, wherein the electrical conductor further comprises a coiled wire.

14. A method as in claim 13, wherein the coiled wire further comprises steel coated with brass.

15. A method as in claim 11, wherein the resilient material is rubber.

16. A method as in claim 15, wherein a portion of the rubber comprises a portion of a tire.

17. A method as in claim 11, wherein at least a portion of the electrical circuit is located upon the support.

18. A durable connection for an electrical circuit in a tire patch, comprising:
    a substrate supporting at least a portion of an electrical circuit;
    a conductor having at least one connecting portion attached to said electrical circuit; and
    a resilient material positioned proximate said connecting portion and surrounding at least part of said conductor, said resilient material attached to said substrate and configured for gradually restricting the mobility of said conductor proximate the connecting portion and in a direction moving along said conductor and towards said electrical circuit.

19. A durable connection as in claim 18, wherein said resilient material is adhered to at least a portion of said conductor.

20. A durable connection as in claim 19, wherein said conductor comprises a coiled wire.

21. A durable connection as in claim 20, wherein said substrate comprises a printed circuit board that includes at least a portion of said electrical circuit.

22. A durable connection as in claim 21, wherein said resilient material is comprised of an elastomer.

23. A durable connection as in claim 20, wherein the coils of said conductor comprise a plurality of pitches along the length of the conductor and wherein the coil pitch proximate said connecting portion is higher than the coil pitch more distant from the connecting portion.

24. A durable connection as in claim 18, further comprising:
a second conductor having at least one portion co-attached to said electrical circuit with the connecting portion of the first named conductor, said second conductor attached to said resilient material,
whereby said second conductor cooperates with the resilient material to restrict the mobility of said first named conductor.

25. A durable connection as in claim 24, wherein said second conductor comprises a wire of predetermined length and wherein said second conductor is co-attached to said electrical circuit at a mid-portion of said second conductor.

26. A durable connection as in claim 24, wherein said second conductor comprises a portion of the first named conductor from the connection portion thereof to an end portion thereof and wherein the second conductor is positioned in a plane substantially parallel to the direction said first named conductor.

27. A durable connection as in claim 26, wherein said first named conductor comprises a coiled wire and a portion of said second conductor is positioned within the coils of said first named conductor proximate said connection portion.

28. A durable connection as in claim 24, wherein said second conductor comprises a protrusion attached to said printed circuit board.

29. A durable connection as in claim 28, wherein said first named conductor is a coiled wire and wherein the coils of said first named conductor are positioned to substantially surround said protrusion.

30. A tire patch comprising:
an electrical circuit;
a substrate carrying said electrical circuit, said substrate having a recessed portion;
an electrical conductor having a predetermined length, said electrical conductor being connected to said electrical circuit at a position that is located at least partially within said recessed portion of said substrate; and
a strain distributing material encasing said electrical circuit and said electrical conductor, whereby the strain distributing material distributes strain of said electrical conductor so as to reduce strain induced damage to said electrical conductor.

31. A tire patch as in claim 30, wherein said electrical conductor comprises a coiled wire.

32. A tire patch as in claim 30, further comprising:
a wire element extending from said recessed portion of said substrate at a location adjacent to said electrical conductor so as to provide additional rigidity.

33. A tire patch as in claim 31, wherein the coils of said coiled wire comprise a plurality of pitches along the length of the conductor and wherein the coil pitch proximate said connection portion is higher than the coil pitch more distant from the connection portion.

34. A tire patch as in claim 30, further comprising:
a pair of stiffening wires located about said recess portion and configured for receipt of at least a portion of said electrical conductor.

35. A tire patch as in claim 30, further comprising:
a substantially rigid element protruding from said recessed portion of said substrate, and wherein said electrical conductor comprises a coiled wire configured such that at least part of said rigid element is contained with one or more coils of said coiled wire.

36. A method for providing a durable electrical connection, comprising:
providing an electrical conductor having at least one end configured for connecting to an electrical circuit;
providing an electrical circuit carried by a substrate;
connecting the at least one portion of the electrical conductor to the electrical circuit;
encasing the electrical conductor and the electrical circuit in a strain distributing material, and
creating a zone in the strain distributing material that reduces the strain upon the electrical conductor proximate to the position where the electrical conductor is attached to the electrical circuit.

37. A method as in claim 36, further comprising the step of bonding the strain distributing material to the electrical conductor.

38. A method as in claim 36, wherein the strain distributing material comprises a resilient material.

39. A method as in claim 38, wherein the resilient material is comprised of rubber.

40. A method as in claim 39, where a portion of the rubber comprises a portion of a tire body.

41. A method as in claim 36, wherein the electrical circuit comprises a printed circuit board.

42. A method as in claim 41, wherein said step of encasing comprises bonding the strain distributing material to the printed circuit board.

43. A method as in claim 36, wherein said step of connecting the portion of the electrical conductor comprises soldering the electrical conductor to the electrical circuit.

44. A method as in claim 36, wherein the electrical conductor comprises a coiled wire.

45. A method as in claim 44, wherein a non-conductive coating is applied to at least a portion of the electrical conductor along a predetermined length.

46. A method as in claim 44, wherein the coils of the conductor are formed with a plurality of pitches along the length of the conductor and wherein the coil pitch proximate the connection is higher than the coil pitch more distant from the connection.

47. A method as in claim 36, where said step of creating a zone further comprises providing the substrate with a recessed area to receive at least a portion of the electrical conductor proximate to where the electrical conductor is attached to the electrical circuit.

48. A method as in claim 36, where said step of creating a zone comprises:
providing the electrical conductor with coils along at least a portion of the conductor's length;
extending a protruding element from the substrate; and
locating the protruding element at least partially within the coils.

49. A method as in claim 36, where said step of creating a zone comprises:
attaching at least one wire element to the substrate at a position near the electrical conductor so as to at least partially stiffen the strain distributing material.

* * * * *